United States Patent [19]

Fatula, Jr. et al.

[11] 4,397,075

[45] Aug. 9, 1983

[54] FET MEMORY CELL STRUCTURE AND PROCESS

[75] Inventors: Joseph J. Fatula, Jr., Beacon, N.Y.; Paul L. Garbarino, Ridgefield, Conn.

[73] Assignee: International Business Machines Corporation, Armonk, N.Y.

[21] Appl. No.: 165,592

[22] Filed: Jul. 3, 1980

[51] Int. Cl.³ .......................................... H01L 21/225
[52] U.S. Cl. ................... 29/571; 29/576 W; 29/580; 156/647; 148/187; 148/188; 357/14; 357/23
[58] Field of Search ..................... 29/571, 576 W, 580; 357/14, 23 C; 156/647; 148/187, 188

[56] References Cited

U.S. PATENT DOCUMENTS

| | | | |
|---|---|---|---|
| 3,387,286 | 6/1968 | Dennard | 357/24 X |
| 3,728,179 | 4/1973 | Davidson et al. | 156/662 X |
| 3,962,713 | 6/1976 | Kendall et al. | 357/14 |
| 3,977,071 | 8/1976 | Jarman | 29/580 |
| 4,017,885 | 4/1977 | Kendall et al. | 148/175 X |
| 4,116,720 | 9/1978 | Vinson | 148/1.5 |
| 4,139,442 | 2/1979 | Bondur et al. | 148/175 X |
| 4,141,765 | 2/1979 | Druminski et al. | 148/175 |
| 4,160,987 | 7/1979 | Dennard et al. | 29/578 X |
| 4,346,513 | 8/1982 | Nishizawa et al. | 148/187 X |

OTHER PUBLICATIONS

Finne et al., "A Water-Amine-Complexing Agent System for Etching Silicon", J. Electrochem. Soc.: Solid State Science, vol. 114, No. 9, Sep. 1967, pp. 965-970.
Greenwood, J. Electrochem. Soc.: Electrochem. Techn., vol. 116, No. 9, Sep. 1969, pp. 1325 and 1326.
Blum et al., IBM Tech. Discl. Bull., vol. 21, No. 9, Feb. 1979, pp. 3814-3817.
Clarke et al., IBM Tech. Discl. Bull., vol. 17, No. 9, Feb. 1975, pp. 2579 and 2580.

Primary Examiner—G. Ozaki
Attorney, Agent, or Firm—George O. Saile

[57] ABSTRACT

A dense, vertical MOS FET memory cell has a high charge storage capacitance per unit area of substrate surface. The charge storage capacitor structure is formed within a well etched in the silicon semiconductor substrate by a combination of reactive ion etching and a self-limiting wet etch.

11 Claims, 15 Drawing Figures

FET MEMORY CELL STRUCTURE AND PROCESS

BACKGROUND OF THE INVENTION

The present invention relates generally to FET Memory Cells and more particularly to a compact memory cell device and the process for forming the device which includes a capacitor structure within a silicon semiconductor body for charge storage.

A single device memory cell with an FET and a capacitor is described by Dennard in U.S. Pat. No. 3,387,286. The capacitor plates are parallel to the surface of the substrate and occupy a relatively large area of the substrate surface. In an effort to reduce the size of the cell, capacitor structures have been formed within the semiconductor substrate, for example, as described in the article "Capacitor For Single FET Memory Cell", IBM Technical Disclosure Bulletin, Vol. 19, No. 9, Pages 2579–2580, February 1975 where the capacitor is formed in a V-shaped trench filled with polysilicon and co-pending application by Abbas entitled "High Density Single Device Memory Cell", Ser. No. 48,410, filed June 14, 1979, now abandoned, in which the capacitor is formed in a U-shaped trench which is reactively ion etched into the silicon surface. Capacitor structures and charge storage regions formed in trenches in a semiconductor body are also described in U.S. Pat. Nos. 3,962,713 and 4,141,765.

BRIEF SUMMARY OF THE INVENTION

We have now discovered an improved memory cell structure and the process for its manufacture.

In accordance with this invention, there is provided a method for producing a dense, vertical MOS FET device comprising the steps of
providing a monocrystalline silicon substrate having a gate including a gate dielectric layer on said substrate, a gate electrode layer on said dielectric layer and source and drain regions in said substrate on opposite sides of said gate;
reactive ion etching a substantially U-shaped opening into said substrate in said drain region adjacent to said gate;
growing a silicon dioxide layer on the surface of said U-shaped opening;
reactive ion etching said U-shaped opening deeper into said substrate to form a deeper U-shaped opening;
etching said deeper opening with a directional etchant to form a well having an enlarged buried opening;
removing said silicon dioxide from said well;
and
diffusing an impurity into the surfaces of said well and forming electrical contacts to said source and drain regions and to said gate electrode layer.

This invention also provides an MOS FET device having a charge storage structure comprising a monocrystalline silicon substrate, whose planar surface has a (100) crystal orientation, a source and a drain formed in said surface, and an insulated gate on said planar surface between said source and drain for selectively rendering a channel in said substrate beneath said gate conductive. The drain includes an extended charge storage region formed in the sides of a well in the substrate. The well includes a first portion having a U-shaped cross section adjacent to the surface of the substrate and an enlarged second portion beneath the first portion whose faces lie along the (111) crystal planes of the silicon substrate.

DETAILED DESCRIPTION

Figure 1:
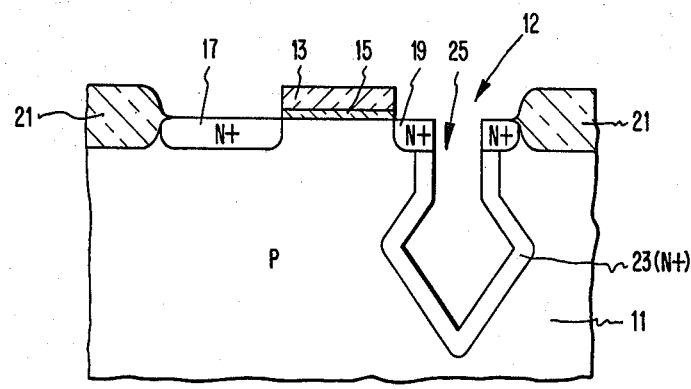
FIG. 1 is a schematic cross section of an embodiment of a memory cell of the invention.

Turning now to FIG. 1 a memory cell structure 12 comprises an FET device formed in a (100) P type monocrystalline semiconductor substrate 11 having a conductive metal gate, for example, aluminum, tantalum, molybdenum, etc., or a polysilicon gate 13, a silicon dioxide gate dielectric layer 15, a N+ type source region 17 and a N+ type drain region 19. Cell structure 12 is isolated from adjacent devices by recessed oxidation regions 21 as is known in the art. In a memory circuit arrangement the cell may function with N+ source region 17 serving as the bit line and polysilicon gate 13 serving as the word line. The memory cell structure 12 has a drain 19 with an enlarged N+ type charge storage region 23 formed in the surface of opening or well 25 in substrate 11.

Figure 2:
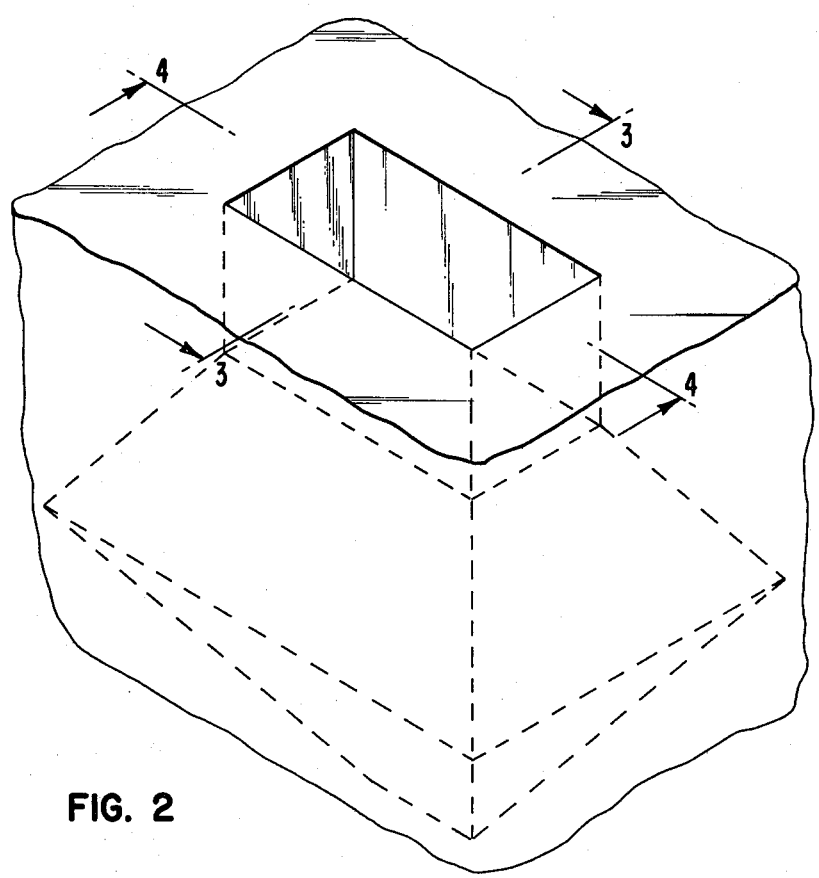
FIG. 2 is an isometric view showing the shape and dimensions of the charge storage well illustrated in FIG. 1.
Figure 3:
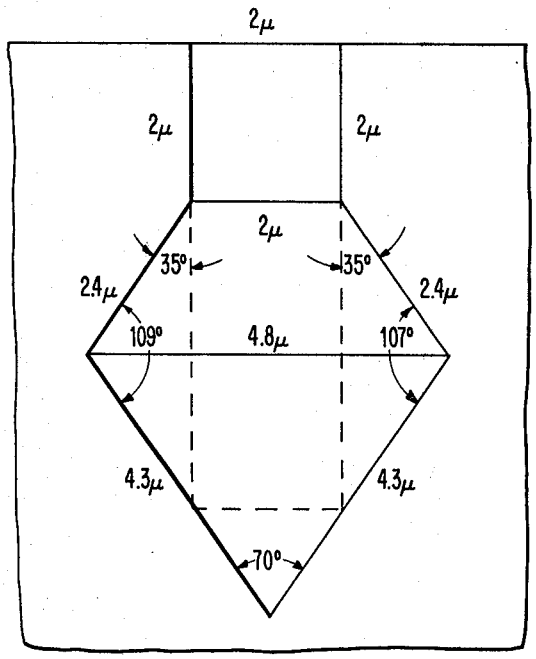
FIG. 3 is a sectional view of the well of FIG. 2 taken along lines 3—3.
Figure 4:
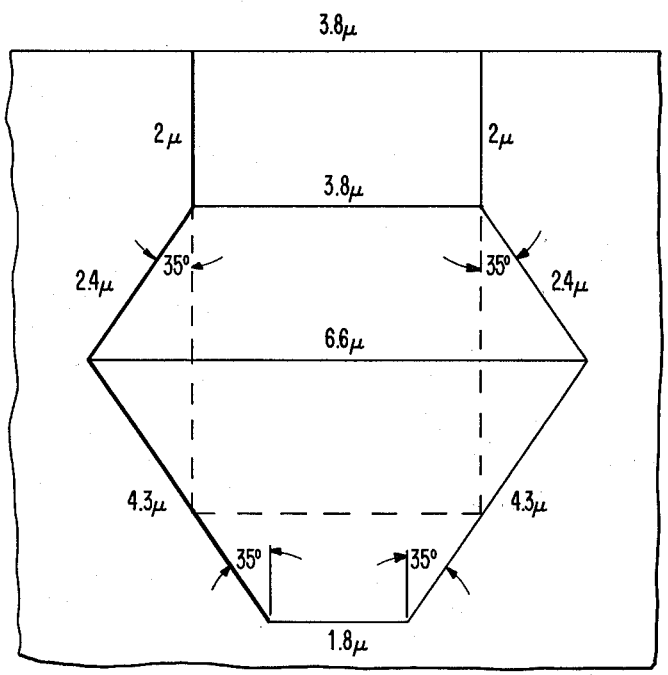
FIG. 4 is a sectional view of the well of FIG. 2 taken along lines 4—4.

FIGS. 2-4 illustrate the dimensions and shape of well 25. Starting with a rectangular opening of 2×3.8 microns in the surface of the substrate, which takes up an area of only 7.6 square microns a total storage area of 103 square microns is provided. This permits a greatly increased storage capacitance per unit area of substrate surface which permits the size of the memory cells to decrease to only ½ to ⅓ the size of standard memory cells while keeping the same capacitance. Also, because of the fact that the lower enlarged portion of the well is formed by a self-limiting etch, in that the etch rate becomes negligible as the (111) termination planes are reached, the size of the enlarged opening is determined by the size of the opening in the surface of the substrate. Therefore, the storage well can be formed without the need to be concerned with etch times because there is no impact on adjacent cells due to over etching. The self-limiting nature of the etch also permits the capacitance of the cell to be easily controlled.

Figure 5:
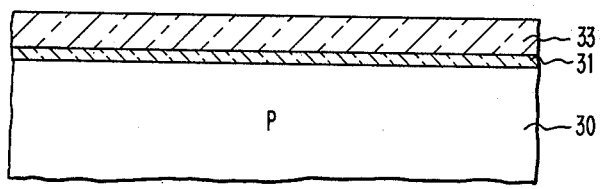
FIGS. 5 to 15 are schematic cross sectional views illustrating the fabrication of an MOS FET device according to the process of the invention.
Figure 6:
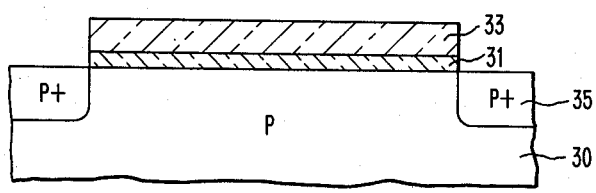
Figure 7:
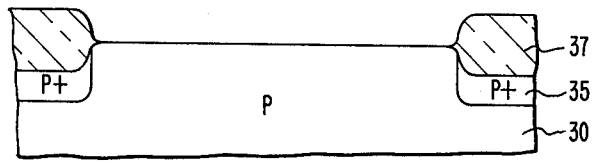
Figure 8:
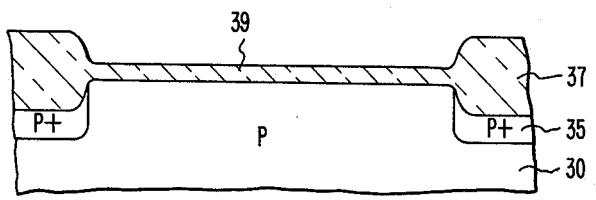
Figure 9:
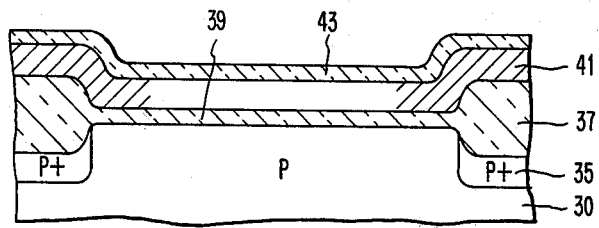

The memory cell can be produced, for example, by the following procedure. A thin, dry, thermal oxidation silicon dioxide layer 31 (FIG. 5) about 400 Å in thickness is grown on a 10–20 ohm/centimeter (100) P type silicon semiconductor substrate 30 followed by an approximately 1,000 Å thick layer of silicon nitride 33 grown by chemical vapor deposition (CVD) from SiH$_4$ and NH$_3$. Nitride layer 33 and oxide layer 31 are then etched by conventional resist techniques and P+ channel stop areas 35 are formed for example by boron ion implantation (FIG. 6). Field oxide 37 is grown in steam to a thickness of about 4,500 to 6,000 Å (FIG. 7). Nitride layer 33 is then removed by etching either by reactive ion etching in CF$_4$ and O$_2$ or by wet etching in phosphoric acid and the silicon dioxide layer is removed by reactive ion etching in CF$_4$ and H$_2$ or in buffered hydrofluoric acid. Dry, thermal, gate oxide layer 39 is then grown to a thickness of about 500 Å (200 to 600 Å) (FIG. 8) and boron is implanted to adjust the FET threshold voltage. Polysilicon layer 41 of about 2,500 Å in thickness (FIG. 9) is deposited by CVD using $SiH_4$ and $H_2$ and is doped (N+) by diffusion with $POCL_3$. After stripping the phosphosilicate glass layer, a layer 43 of CVD silicon dioxide approximately 1,000 Å in thickness is deposited using a mixture of $SiH_4$, $CO_2$ and $H_2$ and the structure is annealed at 1,000° C. for 15 minutes in an oxygen atmosphere.

Figure 10:
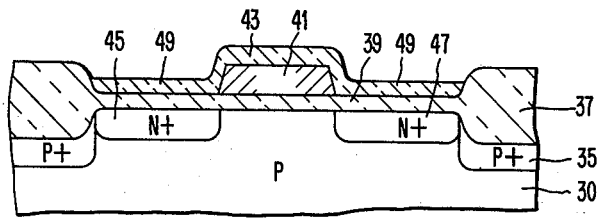

A resist layer (not shown) is applied, patterned and silicon dioxide layer 43 and polysilicon layer 41 are etched with buffered HF and ethylene diamine pyrocatechol respectively (FIG. 10) and the resist layer is stripped. N+ source region 45 and N+ drain region 47 are then formed by ion implantation of arsenic at about 70 KEV to provide an arsenic concentration of about $4 \times 10^{15}$ atoms/centimeter$^2$ in the source and drain regions. Silicon dioxide layer 49 is then grown by dry thermal oxidation including 2% HCL at 1,000° C. to a thickness of about 500 Å.

Figure 11:
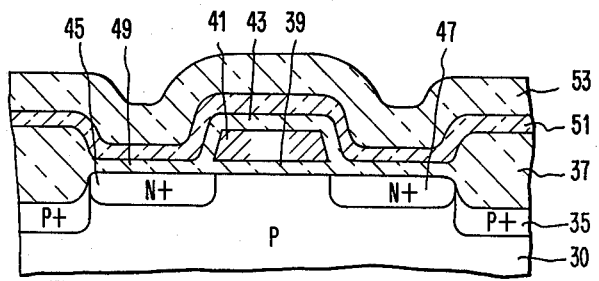
Figure 12:
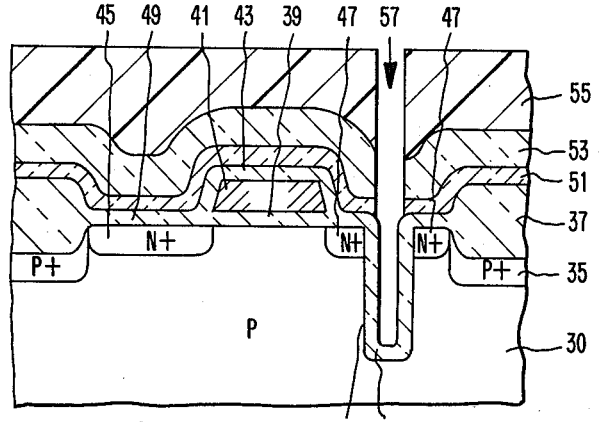
Figure 13:
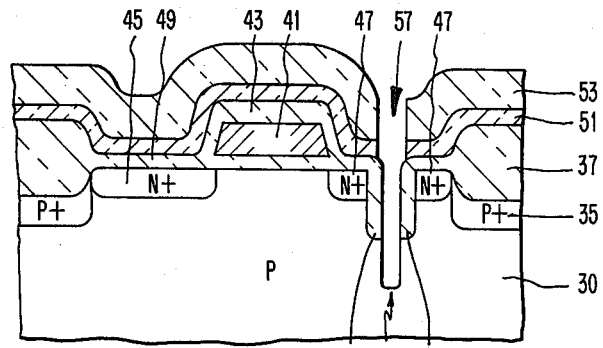
Figure 14:
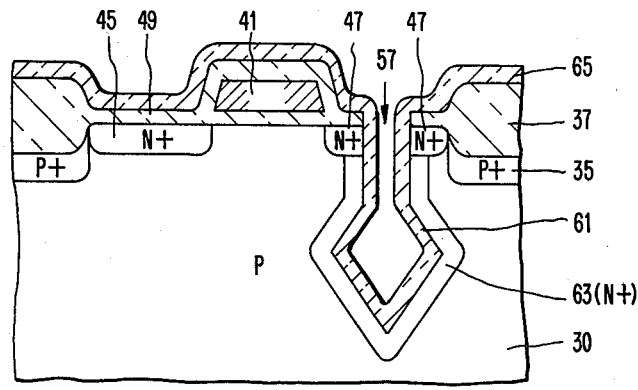
Figure 15:
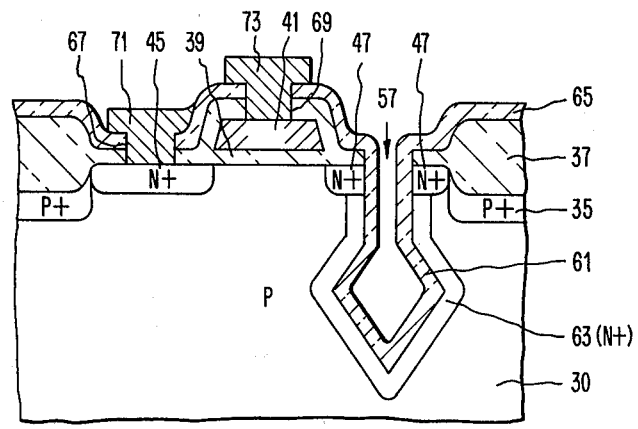

The foregoing is conventional. The charge storage well is then formed by first depositing a 1,000 Å thick layer 51 of CVD silicon nitride followed by a 1 micron thick layer 53 of CVD silicon dioxide and annealing for 15 minutes at 1,000° C. in a nitrogen atmosphere (FIG. 11). A resist layer 55 is then applied and patterned (FIG. 12) to expose the oxide layer 53 in the area of the drain region 47 and oxide layer 53 is reactive ion etched in a $CF_4$ containing atmosphere, for example, a mixture of $CF_4$ and hydrogen. Resist layer can either be stripped or left on during the further reactive ion etching of silicon nitride layer 51, silicon dioxide layer 49 and the silicon substrate 30, to a depth of about 2 microns, in an atmosphere, for example, of $SF_6$, $CF_4$ plus $O_2$, $CCl_4$ or other suitable reactive ion etching gas atmosphere, to form a U-shaped well 57. A thermal or CVD oxide layer 59 is then grown on the faces 61 of 57 to a thickness of about 1,000 Å. The portion of oxide layer 59 at the bottom of well 57 is then reactive ion etched in a mixture of $CF_4$ plus hydrogen which leaves the oxide layer on the sidewalls of opening 57 intact and the reactive ion etching is continued down onto substrate 30 to a total depth of about 6 microns, to deepen well 57 by about 4 microns (FIG. 13). The cross sectional area and the depth of the well can be varied to provide the well surface area needed to obtain the charge storage capacitance desired. The bottom portion 60 of well 57 which is not protected by silicon dioxide layer 59 is then subjected to a directional wet etch in, for example, ethylene diamine pyrocatechol which forms an enlarged opening with the etch being self-limiting in that it terminates when the (111) silicon crystal planes are approached to give the well structure shown in FIG. 14 and illustrated in more detail in FIGS. 2–4. After the directional wet etch, oxide layer 53 and nitride layer 51 are stripped along with the remaining sidewall oxide layer 59. The surface 61 of well 57 is then doped with an N type impurity, for example, by depositing phospho-silicate glass and driving in at 1,000° C. for 30 minutes or by capsule doping and driving in using arsenic or phosphorus to provide N+ region 63. This completes the charge storage drain region of the FET device. If a phosphosilicate glass layer has been employed for doping, it is stripped at this time. The structure is then thermally oxidized to form a first silicon dioxide layer of about 1,000 to 1,500 Å in thickness and then an additional CVD silicon dioxide layer of about 2,000 Å in thickness to form composite layer 65 for contact hole masking. Other suitable dielectric layers such as polyimid can be provided to form composite layer 65. The device is completed by forming contact holes 67 and 69 to source region 45 and gate electrode 41 respectively by resist masking techniques and wet or reactive ion etching followed by the application and patterning of metal contacts 71 and 73 either by lift-off or subtractive etch techniques (FIG. 15).

The process and cell structure of the invention provide increased capacitance per unit of substrate surface area which permits the total cell area size to be reduced, for example, from about 135 square microns for a standard surface storage capacitor to around 55 square microns for the cell of the invention.

What is claimed is:

1. A method for producing a dense MOS FET memory device having a vertical capacitor comprising
   providing a monocrystalline silicon substrate having a gate including a gate dielectric layer on said substrate, a gate electrode layer on said dielectric layer and source and drain regions in said substrate on opposite sides of said gate;
   reactive ion etching a substantially U-shaped opening into said substrate in said drain region adjacent to said gate;
   growing a silicon dioxide layer on the surface of said U-shaped opening;
   reactive ion etching said U-shaped opening deeper into said substrate to form a deeper U-shaped opening;
   etching said deeper opening with a directional etchant to form a well having an enlarged buried opening;
   removing by etching said silicon dioxide from said well;
   diffusing an impurity into the surfaces of said well and;
   forming electrical contacts to the source and to said gate electrode layer.

2. The method of claim 1 wherein the directional etchant is ethylene diamine pyrocatechol.

3. The method of claim 1 wherein the reactive ion etching of said U-shaped opening is in a fluorine or chlorine containing atmosphere.

4. The method of claim 1 wherein said substrate is P type silicon and said impurity is N type.

5. The method of claim 4 wherein said impurity is phosphorus.

6. The method of claim 4 wherein said impurity is arsenic.

7. The method of claim 1 wherein said enlarged buried opening has faces lying along the (111) crystal planes of said substrate.

8. A method for producing a vertical capacitor comprising:
   providing a monocrystalline silicon substrate of a first conductivity type and having a region of a second conductivity type in said substrate;
   reactive ion etching a substantially U-shaped opening into said substrate into and through said region of second conductivity type;
   growing a silicon dioxide layer on the surface of said U-shaped opening;
   reactive ion etching said U-shaped opening deeper into said substrate to form a deeper U-shaped opening;

etching said deeper opening with a directional etchant to form a well having an enlarged buried opening;

removing by etching said silicon dioxide from said well;

diffusing an impurity into the surfaces of said well; and forming electrical contact to the said region of second conductivity type.

9. The method of claim 8 wherein said reactive ion etching of said U-shaped opening is in a fluorine or chlorine containing atmosphere and the said directional etchant is ethylene diamine pyrocatechol.

10. The method of claim 8 wherein said first conductivity type is P type, said second conductivity type is N type, and said substrate is composed of silicon.

11. The method of claim 8 wherein said diffusing is done from a phosphosilicate glass layer that has been formed upon the surface of said well.

* * * * *